(12) United States Patent
Lin et al.

(10) Patent No.: US 8,421,199 B2
(45) Date of Patent: Apr. 16, 2013

(54) SEMICONDUCTOR PACKAGE STRUCTURE

(75) Inventors: Pang-Chun Lin, Taichung (TW);
Chun-Yuan Li, Taichung (TW);
Chien-Ping Huang, Taichung (TW);
Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 293 days.

(21) Appl. No.: 12/770,028

(22) Filed: Apr. 29, 2010

(65) Prior Publication Data
US 2011/0156227 A1 Jun. 30, 2011

(30) Foreign Application Priority Data
Dec. 31, 2009 (TW) .............................. 98146227 A

(51) Int. Cl.
*H01L 23/495* (2006.01)
*H01L 23/48* (2006.01)

(52) U.S. Cl.
USPC ..... 257/676; 257/784; 257/774; 257/E23.037

(58) Field of Classification Search .................. 257/676, 257/784, E23.037, 774
See application file for complete search history.

(56) References Cited

U.S. PATENT DOCUMENTS

| | | | | |
|---|---|---|---|---|
| 5,122,860 A * | 6/1992 | Kikuchi et al. | ............ | 257/679 |
| 5,285,352 A * | 2/1994 | Pastore et al. | ............ | 361/707 |
| 5,508,556 A * | 4/1996 | Lin | ............ | 257/691 |
| 5,942,794 A | 8/1999 | Okumura et al. | | |
| 5,953,589 A * | 9/1999 | Shim et al. | ............ | 438/106 |
| 6,031,292 A * | 2/2000 | Murakami et al. | ............ | 257/778 |
| 6,143,981 A | 11/2000 | Glenn | | |
| 6,238,952 B1 | 5/2001 | Lin | | |
| 6,255,740 B1 * | 7/2001 | Tsuji et al. | ............ | 257/792 |
| 6,291,274 B1 | 9/2001 | Oida et al. | | |
| 6,306,685 B1 * | 10/2001 | Liu et al. | ............ | 438/121 |
| 6,376,921 B1 * | 4/2002 | Yoneda et al. | ............ | 257/787 |
| 6,399,415 B1 | 6/2002 | Bayan et al. | | |
| 6,414,385 B1 | 7/2002 | Huang et al. | | |
| 6,420,779 B1 | 7/2002 | Sharma et al. | | |
| 6,424,024 B1 | 7/2002 | Shih et al. | | |
| 6,498,099 B1 | 12/2002 | McLellan et al. | | |
| 6,700,188 B2 | 3/2004 | Lin | | |
| 6,777,265 B2 | 8/2004 | Islam et al. | | |
| 6,867,493 B2 * | 3/2005 | Hashemi et al. | ............ | 257/717 |
| 7,049,177 B1 | 5/2006 | Fan et al. | | |
| 2002/0168796 A1 * | 11/2002 | Shimanuki et al. | ............ | 438/106 |
| 2004/0097017 A1 * | 5/2004 | Shimanuki | ............ | 438/124 |
| 2011/0001224 A1 * | 1/2011 | San Antonio et al. | ............ | 257/666 |

* cited by examiner

*Primary Examiner* — Nitin Parekh
(74) *Attorney, Agent, or Firm* — Edwards Wildman Palmer LLP; Peter F. Corless; Steven M. Jensen

(57) ABSTRACT

A semiconductor package structure includes: a dielectric layer; a metal layer disposed on the dielectric layer and having a die pad and traces, the traces each including a trace body, a bond pad extending to the periphery of the die pad, and an opposite trace end; metal pillars penetrating the dielectric layer with one ends thereof connecting to the die pad and the trace ends while the other ends thereof protruding from the dielectric layer; a semiconductor chip mounted on the die pad and electrically connected to the bond pads through bonding wires; and an encapsulant covering the semiconductor chip, the bonding wires, the metal layer, and the dielectric layer. The invention is characterized by disposing traces with bond pads close to the die pad to shorten bonding wires and forming metal pillars protruding from the dielectric layer to avoid solder bridging encountered in prior techniques.

8 Claims, 8 Drawing Sheets

SEMICONDUCTOR PACKAGE STRUCTURE

CROSS-REFERENCES TO RELATED APPLICATIONS

This application claims under 35 U.S.C. §119(a) the benefit of Taiwanese Application No. 098146227 filed Dec. 31, 2009 the entire contents of which is incorporated herein by reference.

BACKGROUND OF THE INVENTION

1. Field of the Invention

The present invention relates to semiconductor package structures, and more particularly, to a semiconductor package structure characterized by high quality of wire bonding but not susceptible to solder bridging.

2. Description of Related Art

In a conventional lead frame based semiconductor package such as a QFN (Quad Flat Non-lead) package, a semiconductor chip is attached and wire-bonded to a lead frame and encapsulated by an encapsulant, and metal portions around the lead frame are exposed from the encapsulant to serve as contact pads for connection with an external device. Such a semiconductor package structure is advantageously characterized by reduced size, improved electrical performance, and wide application in the industry.

FIG. 1A shows a conventional semiconductor package structure as disclosed by U.S. Pat. Nos. 6,143,981, 6,424,024, 6,414,385, 5,942,794, 6,420,779, 6,399,415 and 6,291,274.

Referring to FIG. 1A, a semiconductor chip 11 is disposed on a lead frame 10 and electrically connected to contact pads 101 peripherally provided on the lead frame 10 through bonding wires 12, and an encapsulant 13 is formed on the lead frame 10 to encapsulate the semiconductor chip 11 and the bonding wires 12, thereby allowing the side surfaces and bottom surfaces of the contact pads 101 to be exposed from the encapsulant 13.

FIG. 1B is a side view of the semiconductor package structure 1 of FIG. 1A connected to a circuit board 15. Referring to FIG. 1B, the contact pads 101 are connected to solder pads 151 of the circuit board 15 through a solder material 14. However, since the contact pads are closely arranged and do not protrude from the bottom surface of the semiconductor package structure 1, when the semiconductor package structure 1 is soldered to the circuit board 15, the gap between the contact pads 101 and the solder pads 151 of the circuit board 15 is so small that it is difficult to control the gap. As a result, the reliability of the solder joints is low, the solder joints are easy to crack, and the soldering situation is difficult to check. Due to the small gap between the semiconductor package structure 1 and the circuit board 15, the solder material 14 overflows readily to thereby cause solder bridging.

Further, the semiconductor package structure 1 cannot provide array arranged contact pads and accordingly cannot provide a semiconductor package structure with high density I/O connections.

Accordingly, U.S. Pat. Nos. 6,498,099, 7,049,177, 6,238,952, 6,700,188 and 6,777,265 disclose a semiconductor package structure, as shown in FIGS. 2A and 2B.

FIG. 2A is a cross-sectional view of a semiconductor package structure 2 and FIG. 2B is a top view of the semiconductor package structure 2. Referring to FIGS. 2A and 2B, half of the thickness of the lead frame 20 is etched away; a semiconductor chip 21 is disposed on the lead frame 20 and electrically connected to contact pads 201 peripherally provided on the lead frame 20 through bonding wires 22; an encapsulant 23 is formed on the lead frame 20; and then the semiconductor package structure 2 is etched for a second time such that each of the contact pads 201 protrudes from the bottom of the semiconductor package structure 2 by about half of the thickness of the lead frame 20. Further, the contact pads 201 can be arranged in array.

However, although a certain gap is provided between the contact pads and the circuit board and array-arranged contact pads are provided, since long bonding wires are required to electrically connect the semiconductor chip to the contact pads located far away, it adversely affects the electrical performance of the package structure. Further, due to tangling of the bonding wires, it is difficult for the package structure to provide high density I/O connections.

Therefore, it is imperative to overcome the above drawbacks of the prior art.

SUMMARY OF THE INVENTION

In view of the above drawbacks of the prior art, the present invention provides a semiconductor package structure, which comprises: a dielectric layer having a third surface and an opposite fourth surface; a metal layer disposed on the third surface and having a die pad and a plurality of traces, each of the traces comprising a trace body, a bond pad extending to the periphery of the die pad and a trace end opposite to the bond pad; a plurality of metal pillars penetrating the third surface and the fourth surface of the dielectric layer, wherein one ends of the metal pillars exposed from the third surface connect to the die pad and the trace ends, respectively, and the other ends of the metal pillars protrude from the fourth surface, respectively; a semiconductor chip mounted on the die pad; a plurality of bonding wires electrically connecting the semiconductor chip to the bond pads; and an encapsulant covering the semiconductor chip, the bonding wires, the metal layer and the third surface of the dielectric layer.

The semiconductor package structure can further comprise a plurality of metal pads disposed on the ends of the metal pillars protruding from the fourth surface, respectively.

The metal pillars can be made of copper; the dielectric layer can be made of a polymer material comprising an epoxy resin; and the metal layer and the metal pads can be made of one or more selected from the group consisting of Au, Pd, and Ni.

In addition, the contact pad areas are arranged in array to surround the die mounting area, and the bond pads are disposed at the periphery of the die pad, thereby shortening the bonding wires electrically connecting the semiconductor chip and the bond pads.

The present invention further provides a semiconductor package structure, which comprises: a dielectric layer having a third surface and an opposite fourth surface, wherein the third surface has a die mounting area and a plurality of contact pad areas; a plurality of traces disposed on the third surface, each of the traces comprising a trace body, a bond pad extending into the die mounting area and a trace end opposite to the bond pad; a plurality of metal pillars penetrating the third surface and the fourth surface of the dielectric layer, wherein one ends of the metal pillars exposed from the third surface connect to the trace ends, respectively, and the other ends of the metal pillars protrude from the fourth surface, respectively; a semiconductor chip disposed on the bond pads to electrically connect to the traces; and an encapsulant covering the semiconductor chip, the traces and the third surface of the dielectric layer.

According to the present invention, the bond pads and traces formed at the chip mounting side of the dielectric layer shorten the bonding wires and prevent tangling of the bonding wires, thereby improving the electrical connection quality of the package structure. Further, when the semiconductor package structure is soldered to a circuit board, since the metal pillars protrude from the bottom surface of the dielectric layer, it facilitates the formation of stable solder joints between the metal pillars and the circuit board and prevents solder overflow and bridging. In addition, the present invention provides high density and array arranged I/O connections so as to extend the application range of the semiconductor package structure.

BRIEF DESCRIPTION OF DRAWINGS

FIG. 3E is a cross-sectional view taken along line 3E-3E of FIG. 3E'; FIG. 4E is a cross-sectional view taken along line 4E-4E of FIG. 4E'.

DETAILED DESCRIPTION OF PREFERRED EMBODIMENTS

The following illustrative embodiments are provided to illustrate the disclosure of the present invention, these and other advantages and effects can be apparent to those in the art after reading this specification.

Figure 1A:
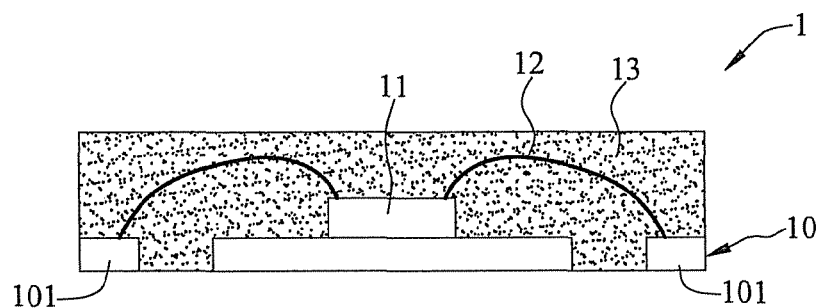
FIG. 1A is a cross-sectional view of a conventional semiconductor package structure.
Figure 1B:
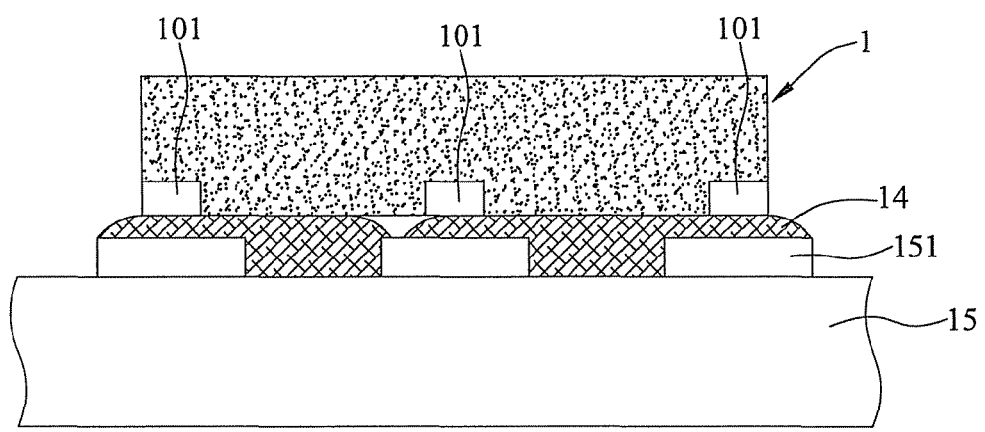
FIG. 1B is a side view of the semiconductor package structure of FIG. 1A connecting to a circuit board.
Figure 2A:
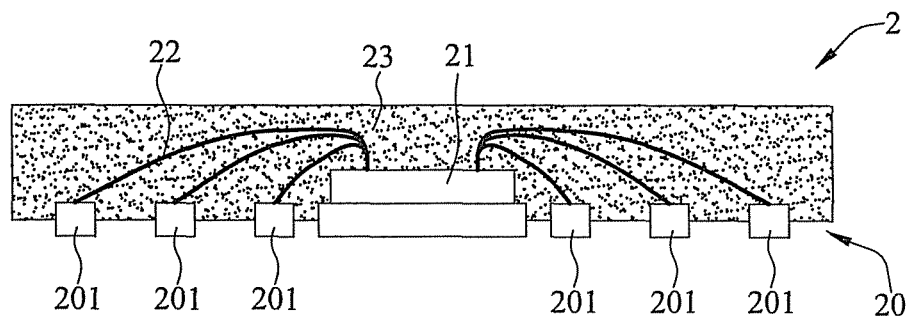
FIGS. 2A and 2B are a cross-sectional view and top view of another conventional semiconductor package structure.
Figure 2B:
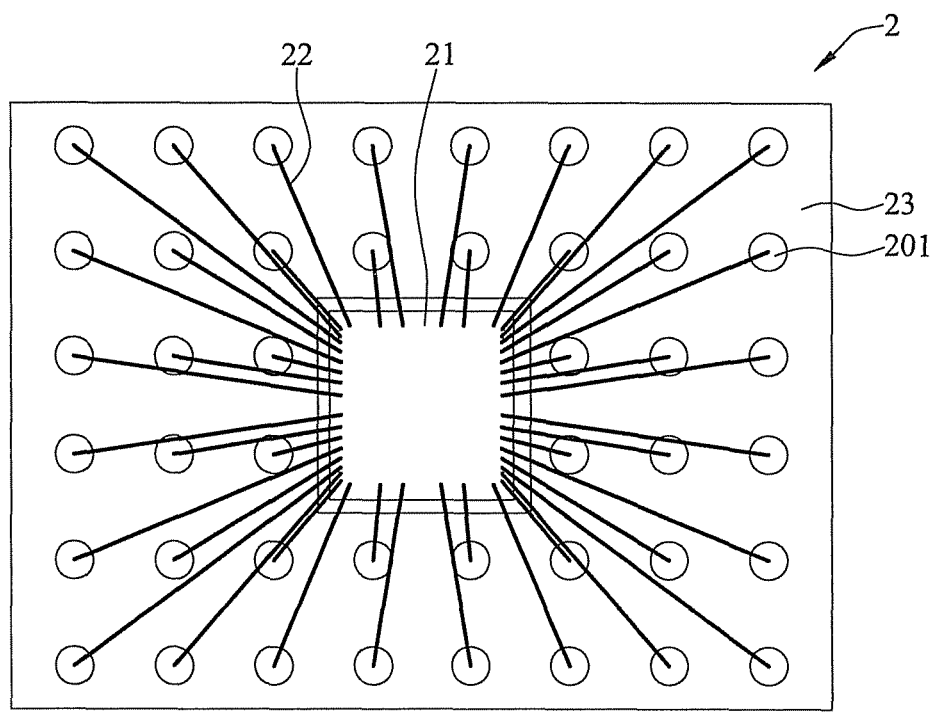
Figure 3A:
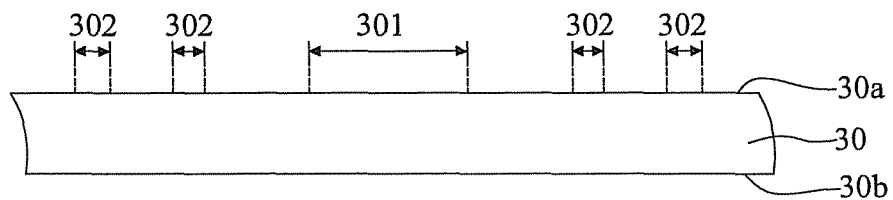
FIGS. 3A to 3G are cross-sectional views showing a semiconductor package structure and a fabrication method thereof according to a preferred embodiment of the present invention, wherein FIG. 3E' is a top view.
Figure 3B:
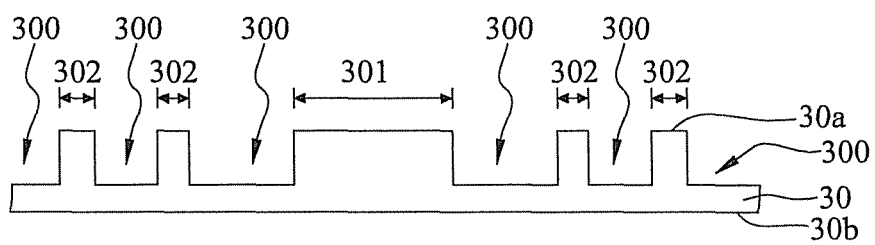
Figure 3C:
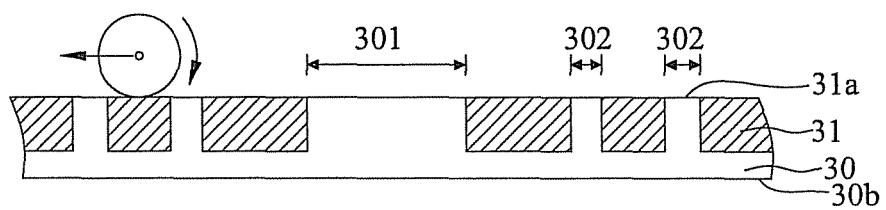
Figure 3D:
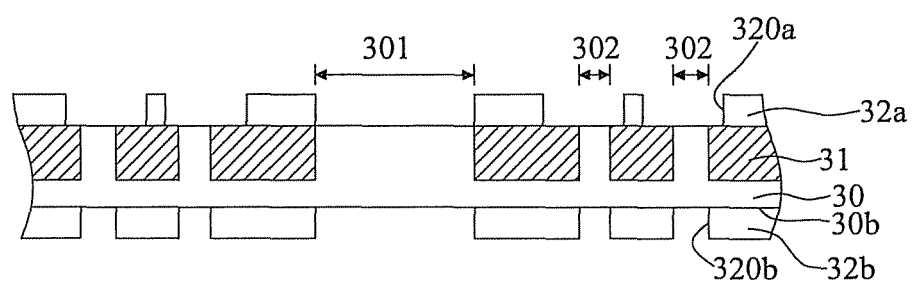
Figure 3E:
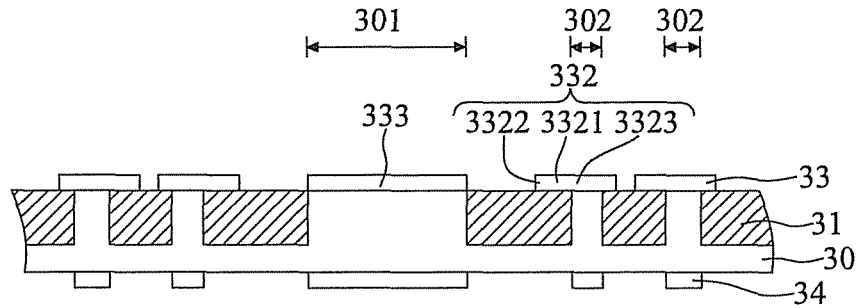
Figure 3E:
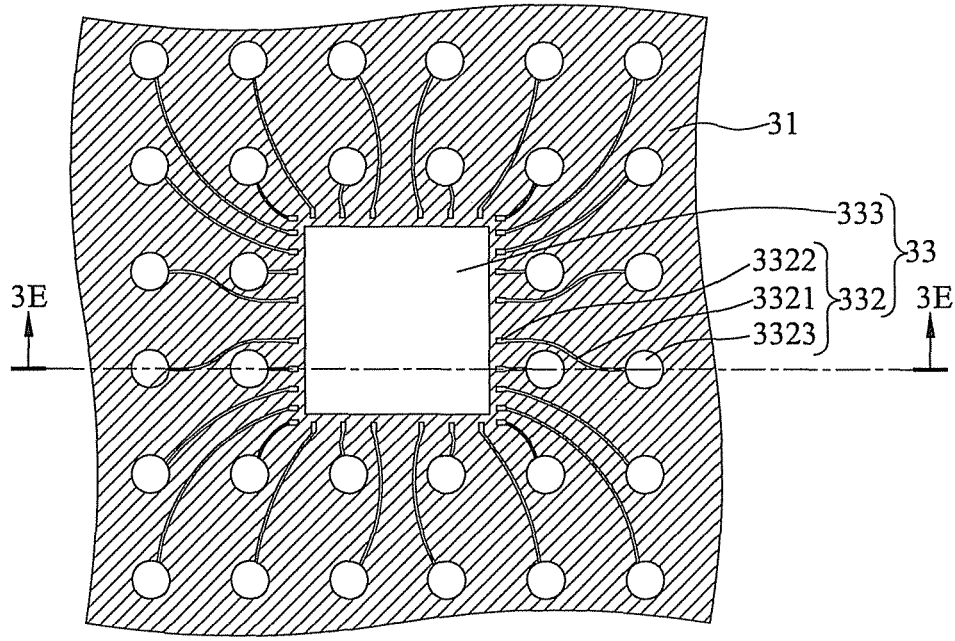

FIGS. 3A to 3G are cross-sectional views showing a semiconductor package structure and a fabrication method thereof according to a preferred embodiment of the present invention, wherein FIG. 3E' is a top view, and FIG. 3E is a cross-sectional view taken along line 3E-3E of FIG. 3E'.

Referring to FIG. 3A, a metal plate 30 having a first surface 30a and an opposite second surface 30b is provided, wherein the first surface 30a has a die mounting area 301 and a plurality of contact pad areas 302. The metal plate 30 can be made of copper.

Referring to FIG. 3B, the metal plate 30 is patterned from the first surface 30a towards the second surface 30b so as to form a plurality of concave portions 300 in the metal plate 30 outside the die mounting area 301 and the contact pad areas 302, wherein the concave portions 300 surrounding the die mounting area 301 and the contact pad areas 302. The patterning of the metal plate 30 or the formation of the concave portions 300 can be implemented by means of a resist layer (not shown) and performed by an etching process. Since such a technique is well known in the art, detailed description thereof is omitted herein.

Referring to FIG. 3C, a dielectric layer 31 is formed on the patterned metal plate 30, with the die mounting area 301 and the contact pad areas 302 exposed from the dielectric layer 31. Specifically speaking, a dielectric layer 31 is coated in the concave portions 300 and on the first surface 30a, and then a portion of the dielectric layer 31 which is higher than the first surface 30a is removed to expose the die mounting area 301 and the contact pad areas 302. The dielectric layer 31 can be made of a polymer material comprising an epoxy resin. In addition, the higher portion of the dielectric layer 31 can be removed by a grinding process such that the dielectric layer 31 thus ground is flush with the surfaces of the die mounting area 301 and the contact pad areas 302.

Referring to FIG. 3D, a first resist layer 32a is formed on the first surface 30a and the dielectric layer 31, and a plurality of first open areas 320a is formed in the first resist layer 32a; meanwhile, a second resist layer 32b is formed on the second surface 30b, and a plurality of second open areas 320b is formed in the second resist layer 32b such that the second open areas 320b thus formed correspond in position to the die mounting area 301 and the contact pad areas 302, respectively.

Referring to FIGS. 3E and 3E', a metal layer 33 is formed in the first open areas 320a, and a plurality of metal pads 34 is formed in the second open areas 320b, respectively. The metal layer 33 comprises a die pad 333 corresponding in position to the die mounting area 301 and a plurality of traces 332. Each of the traces 332 comprises a trace body 3321, a bond pad 3322 extending to the periphery of the die pad 333, and a trace end 3323 opposite to the bond pad 3322 and connected to a corresponding one of the contact pad areas 302. The metal pads 34 correspond in position to the die mounting area 301 and the contact pad areas 302, respectively. Thereafter, the first resist layer 32a and the second resist layer 32b are removed. The metal layer 33 and the metal pads 34 can be formed by an electroplating process and can be made of one or more selected from the group consisting of Au, Pd, and Ni, for example, Au/Pd/Ni/Pd.

Referring to FIG. 3E', the contact pad areas 302 are arranged in array to surround the die mounting area 301, and the bond pads 3322 are disposed at the periphery of the die pad 333 to surround the die pad 333.

Figure 3F:
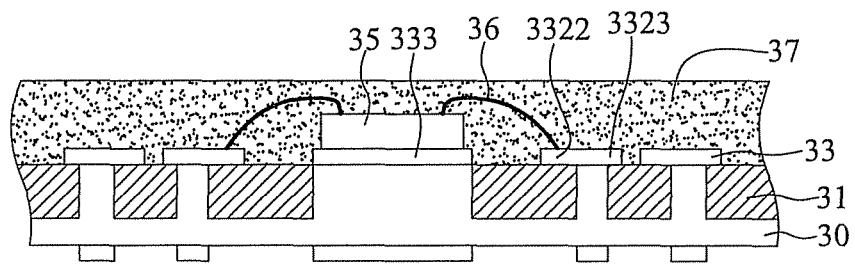

Referring to FIG. 3F, a semiconductor chip 35 is mounted on the die pad 333 and electrically connected to the bond pads 3322 through a plurality of bonding wires 36, and an encapsulant 37 is formed to cover the semiconductor chip 35, the bonding wires 36, the metal layer 33 and the dielectric layer 31.

Figure 3G:
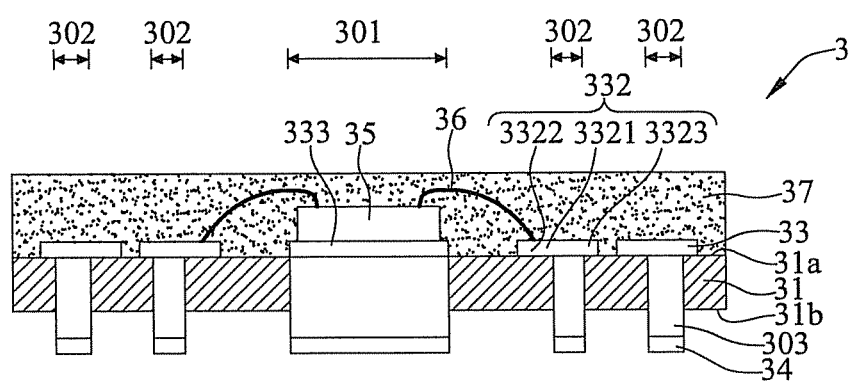

Referring to FIG. 3G, the portions of the metal plate 30 that are not covered by the metal pads 34 are removed so as to form a plurality of metal pillars 303 corresponding in position to the die mounting area 301 and the contact pad areas 302 and protruding from the dielectric layer 31. Finally, a singulation process is performed to obtain a semiconductor package structure 3.

The present invention further discloses a semiconductor package structure 3, which comprises: a dielectric layer 31 having a third surface 31a and an opposite fourth surface 31b; a metal layer 33 disposed on the third surface 31a and comprising a die pad 333 and a plurality of traces 332, each of the traces 332 comprising a trace body 3321, a bond pad 3322 extending to the periphery of the die pad 333, and a trace end 3323 opposite to the bond pad 3322; a plurality of metal pillars 303 penetrating the third surface 31a and the fourth surface 31b of the dielectric layer 31, wherein one ends of the metal pillars 303 exposed from the third surface 31a are connected to the die pad 333 and the trace ends 3323, and the surfaces of the exposed ends of the metal pillars 303 are flush with the third surface 31a, and the other ends of the metal pillars 303 protrude from the fourth surface 31b; a semiconductor chip 35 mounted on the die pad 333; a plurality of bonding wires 36 electrically connecting the semiconductor chip 35 to the bond pads 3322; and an encapsulant 37 covering the semiconductor chip 35, the bonding wires 36, the metal layer 33 and the third surface 31a of the dielectric layer 31.

The semiconductor package structure 3 further comprises a plurality of metal pads 34 disposed on the ends of the metal pillars 303 protruding from the fourth surface 31b, respectively.

In the semiconductor package structure 3, the metal pillars 303 can be made of copper; the dielectric layer 31 can be made of a polymer material comprising an epoxy resin; the metal layer 33 and the metal pads 34 can be made of one or more selected from the group consisting of Au, Pd, and Ni. Preferably, the metal layer 33 and the metal pads 34 are made of the same material.

Further, referring to FIG. 3E', the metal pillars 303 are arranged in array to surround the die pad 333, and preferably, the bond pads 3322 are disposed at the periphery of the die pad 333 to surround the die pad 333.

Figure 4A:
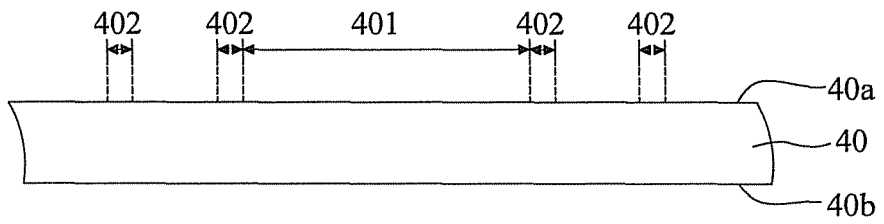
FIGS. 4A to 4G are cross-sectional views showing a semiconductor package structure and a fabrication method thereof according to another embodiment of the present invention, wherein FIG. 4E' is a top view.
Figure 4B:
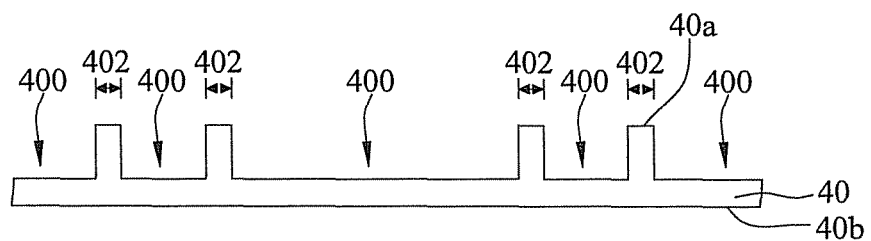
Figure 4C:
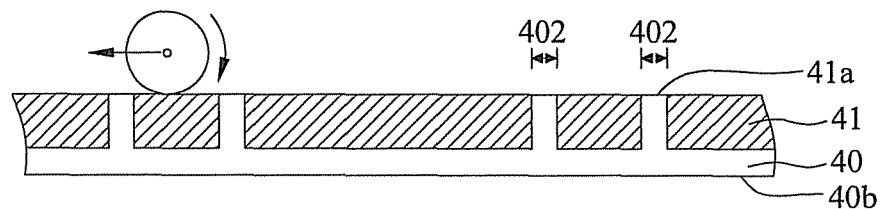
Figure 4D:
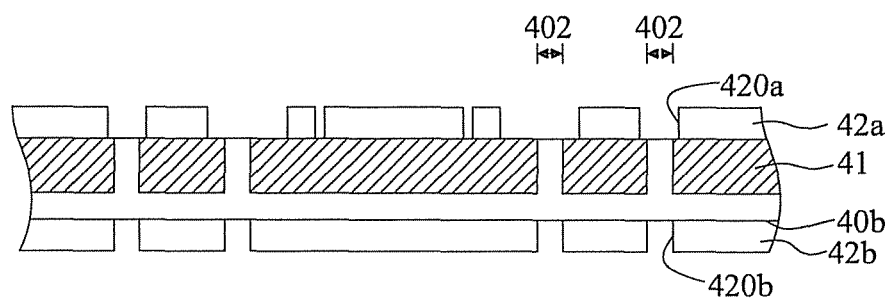
Figure 4E:
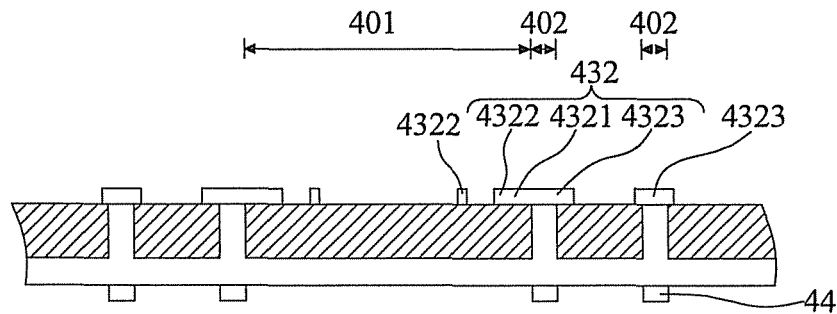
Figure 4E:
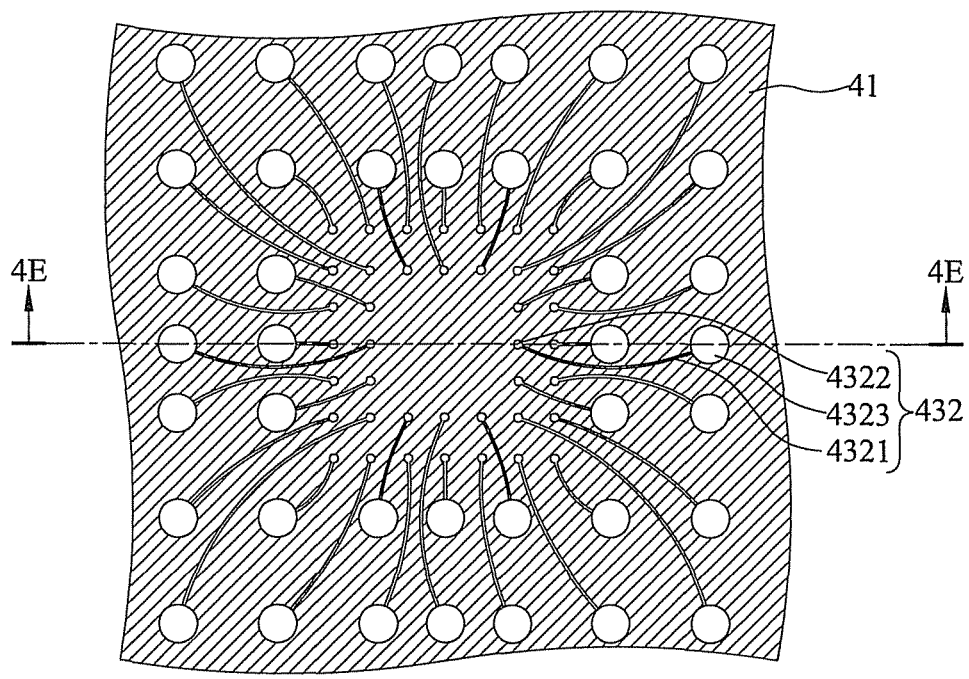

FIGS. 4A to 4G are cross-sectional views showing a semiconductor package structure and a fabrication method thereof according to another embodiment of the present invention, wherein FIG. 4E' is a top view, and FIG. 4E is a cross-sectional view taken along line 4E-4E of FIG. 4E'.

Referring to FIG. 4A, a metal plate 40 having a first surface 40a and an opposite second surface 40b is provided, wherein the first surface 40a has a die mounting area 401 and a plurality of contact pad areas 402. The metal plate 40 can be made of copper.

Referring to FIG. 4B, the metal plate 40 is patterned from the first surface 40a towards the second surface 40b so as to form a plurality of concave portions 400 in the metal plate 40 outside the contact pad areas 402, respectively. The patterning of the metal plate 40 or the formation of the concave portions 4300 can be implemented by means of a resist layer (not shown) and performed by an etching process. Since such a technique is well known in the art, detailed description thereof is omitted herein.

Referring to FIG. 4C, a dielectric layer 41 is formed on the patterned metal plate 40, with the contact pad areas 402 exposed from the dielectric layer 41. Specifically speaking, a dielectric layer 41 is coated in the concave portions 400 and on the first surface 40a, and then a portion of the dielectric layer 41 which is higher than the first surface 40a is removed to expose the contact pad areas 402. The dielectric layer 41 can be made of a polymer material comprising an epoxy resin. In addition, the dielectric layer 41 can be removed by a grinding process such that the dielectric layer 41 thus ground is flush with the surfaces of the contact pad areas 402.

Referring to FIG. 4D, a first resist layer 42a is formed on the first surface 40a and the dielectric layer 41, and a plurality of first open areas 420a is formed in the first resist layer 42a; meanwhile, a second resist layer 42b is formed on the second surface 40b, and a plurality of second open areas 420b is formed in the second resist layer 42b such that the second open areas 420b thus formed correspond in position to the contact pad areas 402, respectively.

Referring to FIGS. 4E and 4E', a plurality of traces 432 is formed in the first open areas 420a, and a plurality of metal pads 44 is formed in the second open areas 420b. Each of the traces 432 comprises a trace body 4321, a bond pad 4322 extending into the die mounting area 401, and a trace end 4323 opposite to the bond pad 4322 and connected to a corresponding one of the contact pad areas 402. The metal pads 44 correspond in position to the contact pad areas 402, respectively. Thereafter, the first resist layer 42a and the second resist layer 42b are removed. The traces 432 and the metal pads 44 can be formed by an electroplating process and can be made of one or more selected from the group consisting of Au, Pd, and Ni, for example, Au/Pd/Ni/Pd.

Referring to FIG. 4E', the contact pad areas 402 can be arranged in array to surround the die mounting area 401, and the bond pads 4322 can be arranged in array in the die mounting area 401.

Figure 4F:
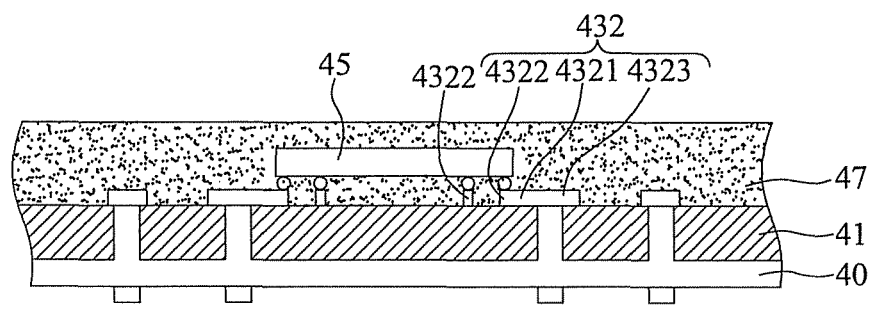

Referring to FIG. 4F, a semiconductor chip 45 is flip-chip mounted on the bond pads 4322 so as to be electrically connected to the traces 432, and an encapsulant 47 is formed to cover the semiconductor chip 45, the traces 432 and the dielectric layer 41.

Figure 4G:
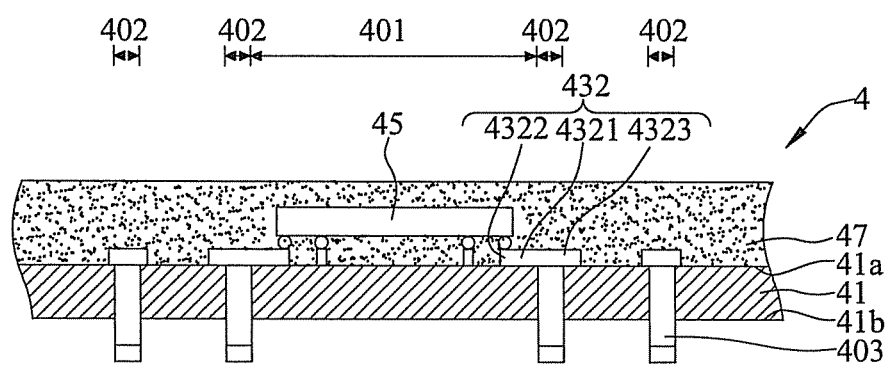

Referring to FIG. 4G the portions of the metal plate 40 that are not covered by the metal pads 44 are removed so as to form a plurality of metal pillars 403 corresponding in position to the contact pad areas 402 and protruding from the dielectric layer 41. Finally, a singulation process is performed to obtain a semiconductor package structure 4.

The present invention further discloses a semiconductor package structure 4, which comprises: a dielectric layer 41 having a third surface 41a and an opposite fourth surface 41b, the third surface 41a having a die mounting area 401 and a plurality of contact pad areas 402; a plurality of traces 432 disposed on the third surface 41a, each of the traces 432 comprising a trace body 4321, a bond pad 4322 extending into the die mounting area 401, and a trace end 4323 opposite to the bond pad 4322; a plurality of metal pillars 403 penetrating the third surface 41a and the fourth surface 41b of the dielectric layer 41, wherein one end of each of the metal pillars 403 is exposed from the third surfaces 41a and connected to the trace ends 4323 of the traces 432, allowing the exposed surfaces of the ends of the metal pillars 403 to be flush with the third surface 41a of the dielectric layer 41, and the other ends of the metal pillars 403 protrude from the fourth surface 41b; a semiconductor chip 45 mounted on the bond pads 4322 and electrically connected to the traces 432; and an encapsulant 47 covering the semiconductor chip 45, the traces 432 and the third surface 41a of the dielectric layer 41.

The semiconductor package structure 4 can further comprise a plurality of metal pads 44 disposed at the ends of the metal pillars 403 protruding from the fourth surface 41b, respectively.

In the semiconductor package structure 4, the metal pillars 403 can be made of copper; the dielectric layer 41 can be made of a polymer material comprising an epoxy resin; the traces 432 and the metal pads 44 can be made of one or more selected from the group consisting of Au, Pd, and Ni. Preferably, the traces 432 and the metal pads 44 are made of the same material.

Further, referring to FIG. 4E', the metal pillars 403 can be arranged in array to surround the die mounting area 401, and preferably, the bond pads 4322 are annularly arranged within the die mounting area 401.

According to the present invention, the bond pads and traces formed at the chip mounting side of the dielectric layer shorten the bonding wires and prevent tangling of the bonding wires, thereby improving the electrical connection quality of the package structure. Further, when the semiconductor package structure is soldered to a printed circuit board, since the metal pillars protrude from the bottom surface of the dielectric layer, it facilitates the formation of stable solder joints between the metal pillars and the printed circuit board and prevents solder overflow and bridging. In addition, the present invention provides high density and array arranged I/O connections so as to extend the application range of the semiconductor package structure.

The above description of the specific embodiments is intended to illustrate the preferred implementation according to the present invention but is not intended to limit the scope of the present invention. Accordingly, all modifications and variations completed by those with ordinary skill in the art should fall within the scope of present invention defined by the appended claims.

What is claimed is:

1. A semiconductor package structure, comprising:
   a dielectric layer having a third surface and an opposite fourth surface;
   a metal layer disposed on the third surface and having a die pad and a plurality of traces, the traces each comprising a trace body, a bond pad extending to a periphery of the die pad, and a trace end opposite to the bond pad;
   a plurality of metal pillars penetrating the third surface and the fourth surface of the dielectric layer, wherein an end of each of the metal pillars is exposed from the third surface and connected to the die pad and the trace ends, and the other ends of the metal pillars protrude from the fourth surface;
   a plurality of metal pads disposed on the ends of the metal pillars protruding from the fourth surface without contacting the fourth surface, respectively;
   a semiconductor chip mounted on the die pad;
   a plurality of bonding wires electrically connecting the semiconductor chip to the bond pads, respectively; and
   an encapsulant covering the semiconductor chip, the bonding wires, the metal layer, and the third surface of the dielectric layer.

2. The structure of claim 1, wherein the metal pads are made of one or more selected from the group consisting of Au, Pd, and Ni.

3. The structure of claim 1, wherein the metal pillars are made of copper.

4. The structure of claim 1, wherein the dielectric layer is made of a polymer material comprising an epoxy resin.

5. The structure of claim 1, wherein the metal layer is made of one or more selected from the group consisting of Au, Pd, and Ni.

6. The structure of claim 1, wherein the metal pillars are arranged in array to surround the die pad.

7. The structure of claim 1, wherein the bond pads are disposed at a periphery of the die pad.

8. The structure of claim 1, wherein the third surface of the dielectric layer is flush with the exposed surfaces of the metal pillars.

* * * * *